United States Patent
Cowley et al.

(10) Patent No.: US 11,876,954 B2
(45) Date of Patent: Jan. 16, 2024

(54) STITCHED INTEGRATED CIRCUIT DIES

(71) Applicant: SEMICONDUCTOR COMPONENTS INDUSTRIES, LLC, Phoenix, AZ (US)

(72) Inventors: Nicholas Paul Cowley, Wroughton (GB); Andrew David Talbot, Chieveley (GB)

(73) Assignee: SEMICONDUCTOR COMPONENTS INDUSTRIES, LLC, Scottsdale, AZ (US)

(*) Notice: Subject to any disclaimer, the term of this patent is extended or adjusted under 35 U.S.C. 154(b) by 0 days.

(21) Appl. No.: 17/816,224

(22) Filed: Jul. 29, 2022

(65) Prior Publication Data

US 2022/0368885 A1 Nov. 17, 2022

Related U.S. Application Data

(63) Continuation of application No. 16/949,324, filed on Oct. 26, 2020, now Pat. No. 11,438,574.

(51) Int. Cl.
| | |
|---|---|
| *H04N 17/00* | (2006.01) |
| *H04N 25/79* | (2023.01) |
| *H04N 25/771* | (2023.01) |
| *H01L 27/146* | (2006.01) |

(52) U.S. Cl.
CPC ......... *H04N 17/002* (2013.01); *H04N 25/771* (2023.01); *H04N 25/79* (2023.01); *H01L 27/14603* (2013.01)

(58) Field of Classification Search
CPC .... H04N 17/002; H04N 25/771; H04N 25/79; H04N 25/41; H01L 27/14603
See application file for complete search history.

(56) References Cited

U.S. PATENT DOCUMENTS

| | | | | |
|---|---|---|---|---|
| 5,883,830 | A | * | 3/1999 | Hirt ........................ H04N 25/67 365/115 |
| 2005/0251721 | A1 | | 11/2005 | Ramesh et al. |
| 2006/0018159 | A1 | | 1/2006 | Picca et al. |
| 2007/0268761 | A1 | | 11/2007 | Singh |
| 2016/0320445 | A1 | | 11/2016 | Lin et al. |
| 2019/0280028 | A1 | | 9/2019 | de Haan et al. |
| 2020/0084437 | A1 | | 3/2020 | Feekes et al. |
| 2021/0243399 | A1 | * | 8/2021 | Sakakibara .......... H04N 25/767 |

FOREIGN PATENT DOCUMENTS

| | | |
|---|---|---|
| EP | 0239196 B1 | 9/1987 |
| WO | 1998038577 A1 | 9/1998 |

* cited by examiner

*Primary Examiner* — Michael E Teitelbaum
(74) *Attorney, Agent, or Firm* — Treyz Law Group, P.C.; Tianyi He

(57) ABSTRACT

An image sensor may be implemented using a stitched image sensor die. The stitched image sensor die may be formed from a step and repeat exposure process using a set of tiles in a reticle set. Multiple instantiations of a same circuitry block on a given tile may be patterned and formed on the image sensor die. The image sensor die may include circuitry configured to enable testing of one or more instantiations of the same circuitry block. The image sensor die may include memory circuitry for storing indications of a functional instantiation of the multiple instances and may use the functional instantiation for normal operation.

20 Claims, 4 Drawing Sheets

US 11,876,954 B2

STITCHED INTEGRATED CIRCUIT DIES

This application is a continuation of U.S. patent application Ser. No. 16/949,324, filed Oct. 26, 2020, which is hereby incorporated by reference herein in its entirety.

BACKGROUND

This relates generally to systems having stitched integrated circuit dies and more specifically to systems and methods for improving yield for stitched image sensor dies.

In some applications, image sensor integrated circuit dies on a wafer are each formed by combining or stitching multiple instantiations of selected tiles in the same reticle set (e.g., by stepping and repeatedly exposing the wafer at different locations using tiles in the same reticle set). The tiles in the reticle set are typically designed to include patterns defining one or more peripheral circuitry tiles and one or more pixel tiles, where the pattern image on each tile defines one or more corresponding (IP) circuitry blocks used to perform respective functions at corresponding locations on the image sensor die.

After forming an image sensor die, a particular instantiation of each corresponding circuitry block may be selected and assigned to perform the respective function of that circuitry block by hard-coding a dedicated routing layout, which hard enables (e.g., enables in a manner such that it cannot be altered without a redesign, more or less, permanently enables) that particular instantiation. However, in instances where that particular instantiation is faulty (e.g., nonfunctional), the entire image sensor may be rendered inoperable.

It is within this context that the embodiments herein arise.

DETAILED DESCRIPTION

Electronic devices such as digital cameras, computers, cellular telephones, and other electronic devices may include image sensors that gather incoming light to capture an image. The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
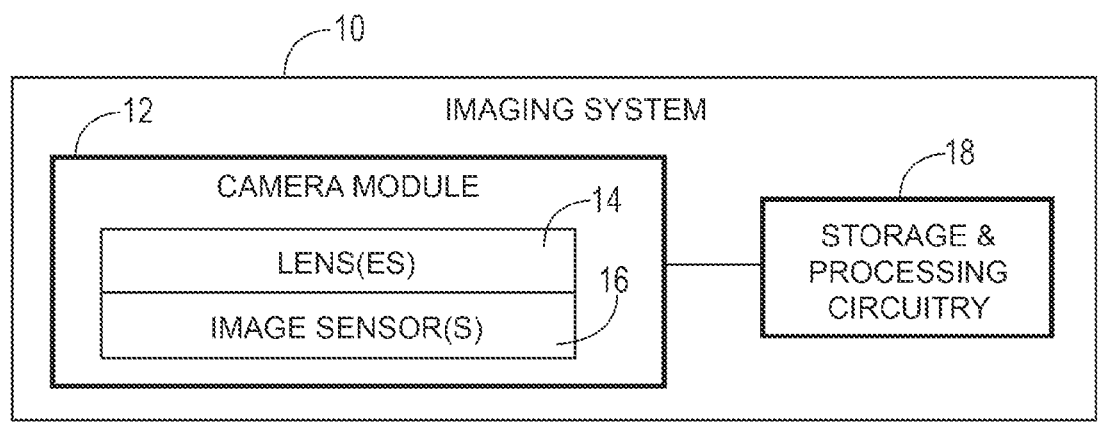
FIG. 1 is a diagram of an illustrative electronic device having an image sensor and processing circuitry for capturing images in accordance with some embodiments.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, an augmented reality and/or virtual reality system, an unmanned aerial vehicle system (e.g., a drone), an industrial system, or any other desired imaging system or device that captures digital image data. Camera module 12 (sometimes referred to as an imaging module) may be used to convert incoming light into digital image data. Camera module 12 may include one or more lenses 14 and one or more corresponding image sensors 16. During image capture operations, light from a scene may be focused onto image sensor 16 by lenses 14. Image sensor 16 may include circuitry for converting analog pixel image signals into corresponding digital image data that is provided to storage and processing circuitry 18.

Storage and processing circuitry 18 may include one or more integrated circuits (e.g., image processing circuits, microprocessors, storage devices such as random-access memory and non-volatile memory, etc.) and may be implemented using components that are separate from the camera module and/or that form part of the camera module (e.g., circuits that form part of an integrated circuit that includes image sensors 16 or an integrated circuit within the module that is associated with image sensors 16). When storage and processing circuitry 18 is included on different integrated circuits than those of image sensors 16, the integrated circuits with circuitry 18 may be vertically stacked or packaged with respect to the integrated circuits with image sensors 16. Image data that has been captured by the camera module may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, an external display, or other devices) using wired and/or wireless communications paths coupled to processing circuitry 18.

Figure 2:
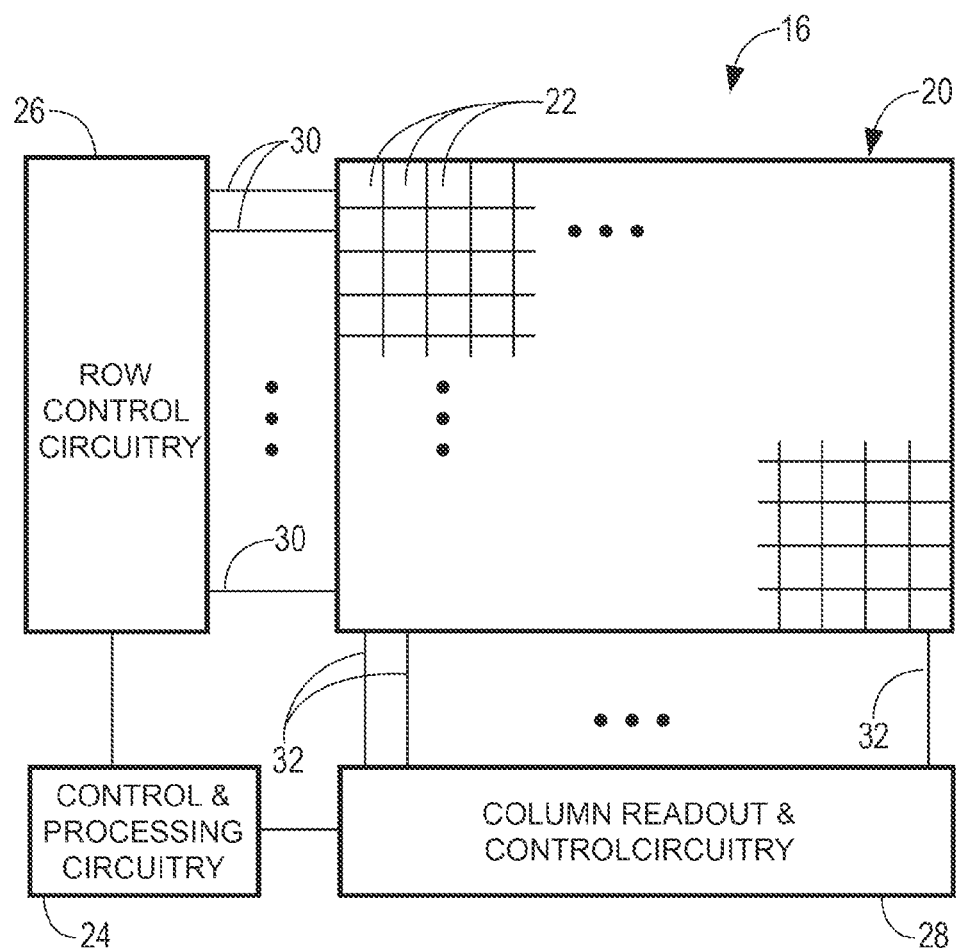
FIG. 2 is a diagram of an illustrative pixel array and associated control and readout circuitry for controlling the pixel array and reading out image signals from the pixel array in accordance with some embodiments.

As shown in FIG. 2, image sensor 16 may include a pixel array 20 containing image sensor pixels 22 arranged in rows and columns (sometimes referred to herein as image pixels or pixels) and control and processing circuitry 24. Array 20 may contain, for example, hundreds or thousands of rows and columns of image sensor pixels 22. Control circuitry 24 may be coupled to row control circuitry 26 (sometimes referred to as row driver circuitry or row drivers) and column readout circuitry 28 (sometimes referred to as column control circuitry, image readout circuitry, readout circuitry, processing circuitry, or column decoder circuitry). Row control circuitry 26 may receive row addresses from control circuitry 24 and supply corresponding row control signals such as reset, anti-blooming, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Column readout circuitry 28 may receive image signals (e.g., analog pixel values generated by pixels 22) over column lines 32. Column readout circuitry 28 may include memory circuitry for temporarily storing calibration signals (e.g., reset level signals, reference level signals) and/or image signals (e.g., image level signals) read out from array 20, amplifier circuitry or a multiplier circuit, analog to digital conversion (ADC) circuitry, bias circuitry, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Column readout circuitry 28 may supply digital pixel data to control and processing circuitry 24 and/or processor 18 (FIG. 1) for pixels in one or more pixel columns.

Pixel array 20 may also be provided with a filter array having multiple (color) filter elements (each corresponding to a respective pixel) which allows a single image sensor to sample light of different colors or sets of wavelengths. As an example, image sensor pixels such as the image pixels in array 20 may be provided with a color filter array having red, green, and blue filter elements, which allows a single image sensor to sample red, green, and blue (RGB) light using corresponding red, green, and blue image sensor pixels arranged in a Bayer mosaic pattern.

In other suitable examples, the green pixels in a Bayer pattern may be replaced by broadband image pixels having broadband color filter elements (e.g., clear color filter elements, yellow color filter elements, etc.), or one of the green pixels in a Bayer pattern may be replaced by infrared (IR) image pixels formed under IR color filter elements and/or the remaining red, green, and blue image pixels may also be sensitive to IR light (e.g., may be formed under filter elements that pass IR light in addition to light of their respective colors). These examples are merely illustrative and, in general, filter elements of any desired color and/or wavelength and in any desired pattern may be formed over any desired number of image pixels 22.

Image sensor 16 may include one or more arrays 20 of image pixels 22. Image pixels 22 may be formed in a semiconductor substrate using complementary metal-oxide-semiconductor (CMOS) technology or charge-coupled device (CCD) technology or any other suitable photosensitive devices technology. Image pixels 22 may be frontside illumination (FSI) image pixels or backside illumination (BSI) image pixels. If desired, image sensor 16 may include an integrated circuit package or other structure in which multiple integrated circuit substrate layers or chips are vertically stacked with respect to each other.

In some applications, image sensor 16 in FIGS. 1 and 2 may be implemented using a stitched image sensor die. In particular, a stitched image sensor die (e.g., formed using one-dimensional or two-dimensional stitching) may be constructed from a step and repeat exposure process using a small number of tiles, such as four tiles, contained on a single reticle set (e.g., each of the same tile may be exposed at multiple locations across the image sensor die).

Figures 3, 4A:
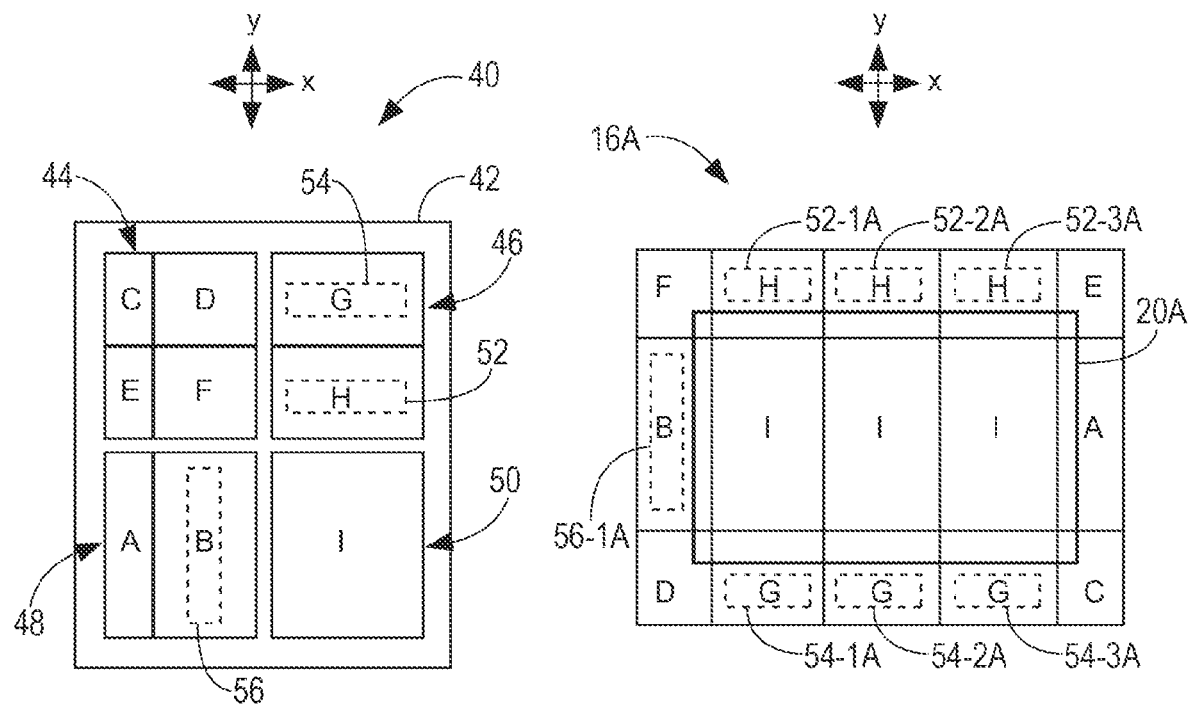
FIG. 3 is a diagram of an illustrative reticle set having tiles that contain various circuitry blocks and that are useable in forming a stitched integrated circuit die in accordance with some embodiments.
FIGS. 4A and 4B are diagrams of two illustrative integrated circuit die layouts formed using tiles from the reticle set of FIG. 3 and containing multiple instantiations of some circuitry blocks in accordance with some embodiments.

In particular, FIG. 3 is a diagram of an illustrative reticle set 40 (e.g., 2-D stitched mask set) containing four tiles 44, 46, 48, and 50. As shown in FIG. 3, reticle set 40 may have a reticle (size) limit indicated by box 42 having a first length along a first dimension (e.g., the x-dimension) and a second length along a second perpendicular dimension (e.g., the y-dimension). The tiles in reticle set 40 collectively need to be within the reticle size limit in order to meet processing requirements. Configurations in which reticle set 40 is used to form image sensor integrated circuit dies are described herein as illustrative examples. If desired, reticle set 40 may similarly be used to form integrated circuit dies for other functions.

In the example of FIG. 3, tile 48 (e.g., a left and right peripheral tile) includes portions A and B, where portion B contains the circuit design (e.g. circuit pattern for exposure or pattern image) for the left-side peripheral circuitry and portion A contains the circuit design for the right-side peripheral circuitry. Tile 46 (e.g., a top and bottom peripheral tile) includes portions G and H, where portion G contains the circuit design for the bottom-side peripheral circuitry and portion H contains the circuit design for the top-side peripheral circuitry. Tile 44 (e.g., a corner peripheral tile) includes portions C, D, E, and F, where portion C contains the circuit design for the bottom-right corner peripheral circuitry, portion D contains the circuit design for the bottom-left corner peripheral circuitry, portion E contains the circuit design for the top-right corner peripheral circuitry, and portion F contains the circuit design for the top-left corner peripheral circuitry. Tile 50 (e.g., a center tile) having portion I may contain the circuit design for active pixel circuitry (e.g., for pixel array 20 in FIG. 2).

In some configurations, the peripheral tiles 44, 46, and 48 may each include non-pixel circuitry (e.g., non-pixel intellectual property (IP) blocks) such as processing circuitry, storage circuitry, power management circuitry, system or local clock circuitry, timing control circuitry, input-output or interface circuitry, control circuitry for controlling pixel circuitry (e.g., control circuitry 24, 26, and/or 28 in FIG. 2), readout circuitry for reading out signals from pixel circuitry (e.g., readout circuitry 28 in FIG. 2), pixel circuitry (e.g., pixel IP blocks) such as reference pixels, keep out zone (KOZ) pixels, and active pixels (e.g., implementing some portion of pixels in array 20 in FIG. 2), and/or any other suitable circuitry. In these configurations, the center tile may include only active pixel circuitry implementing active pixels (e.g., implementing the majority of pixels in array 20 in FIG. 2). These examples are merely illustrative. If desired, each tile may include any suitable circuitry (e.g., one or more corresponding circuitry blocks such as IP blocks having respective functions).

In the example of FIG. 3, tile portion H may include (circuit designs for) circuitry block 52 (e.g., IP block 52) serving a respective function on a die layout (e.g., one or more of the functions described above in connection with non-pixel circuitry and/or one or more function described in connection with pixel circuitry). Tile portion G may include (circuit designs for) circuitry block 54 (e.g., IP block 54) serving a respective function on the die layout (e.g., one or more of the functions described above in connection with non-pixel circuitry and/or one or more function described in connection with pixel circuitry). Tile portion B may include (circuit designs for) circuitry block 56 (e.g., IP block 56)

serving a respective function on the die layout (e.g., one or more of the functions described above in connection with non-pixel circuitry and/or one or more function described in connection with pixel circuitry). While only three of these circuitry blocks are explicitly shown in FIG. 3, each tile portion may include any suitable number of circuitry blocks.

As described above, a stitched image sensor die may be built up from multiple exposures of the individual tiles. In particular, to construct the stitched image sensor die, some tiles such as peripheral circuitry tiles 46 and 48, and center pixel tile 50 may be exposed (e.g., stamped) multiple times at multiple locations by stepping across the die. Consequently, multiple instantiations of the circuitry blocks on tiles 46, 48, and 50 (e.g., circuitry blocks 52, 54, and 56) are formed on the stitched image sensor die.

Figure 4B:
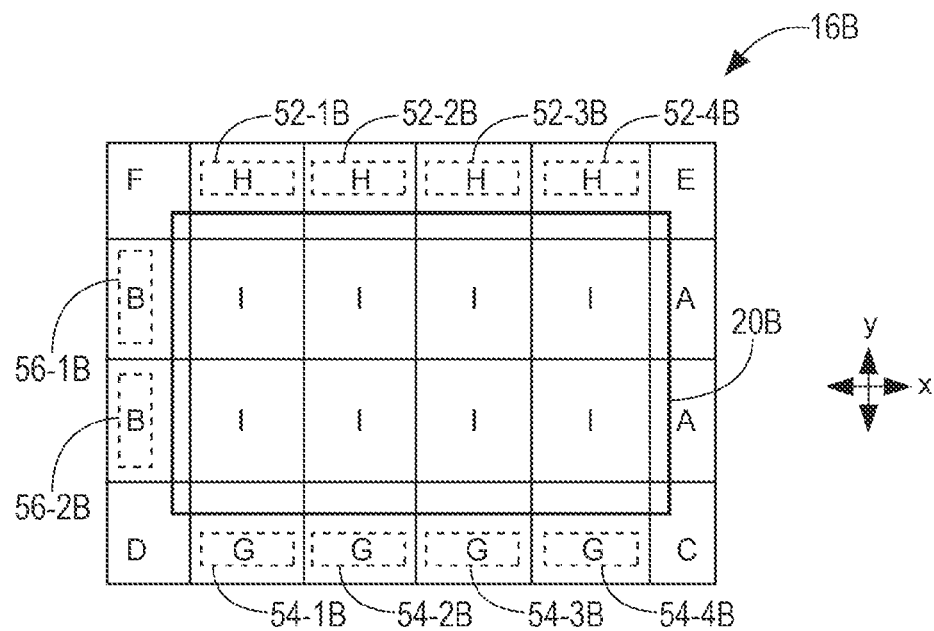

FIGS. 4A and 4B are two illustrative diagrams showing two different die layouts formed from a reticle set of the type shown in FIG. 3. As an example, image sensor 16A in FIG. 4A may have a die layout with three instantiations of center pixel tile 50 (e.g., in a 3×1 pattern) forming a majority of pixel array 20A and a corresponding number of peripheral tile instantiations (e.g., one instantiation of corner tile 44, one instantiation of left and right tile 48, and three instantiations of top and bottom tile 46) forming the non-pixel circuitry in image sensor 16A (and optionally a portion of the pixel circuitry such as a portion of pixel array 20A or inactive pixels). Each of the circuitry blocks or tile portions A to I are shown to be separated from each other by stitch boundaries.

In particular, each instantiation of top and bottom tile 46 may include one instantiation of top tile portion H and one instantiation of bottom tile portion G. As shown in FIG. 4A, image sensor 16A may include three instantiations of top tile portion H, each containing an instantiation of circuitry block 52 (e.g., circuitry block instantiations 52-1A, 52-2A, and 52-3A), and three instantiations of bottom tile portion G, each containing an instantiation of circuitry block 54 (e.g., circuitry block instantiations 54-1A, 54-2A, and 54-3A). Similarly, each instantiation of left and right tile 48 may include one instantiation of left tile portion B and one instantiation of right tile portion A. Additionally, image sensor 16A may include one instantiation of left tile portion B containing one instantiation of circuitry block 56 (specifically labelled circuitry block 56-1A) and one instantiation of right tile portion A.

As another example, image sensor 16B in FIG. 4B may have a die layout with eight instantiations of center pixel tile 50 (e.g., in a 4×2 pattern) forming a majority of pixel array 20B and a corresponding number of peripheral tile instantiations (e.g., one instantiation of corner tile 44, two instantiations of left and right tile 48, and four instantiations of top and bottom tile 46) forming the non-pixel circuitry in image sensor 16B (and optionally a portion of the pixel circuitry such as a portion of pixel array 20B or inactive pixels).

As shown in FIG. 4A, image sensor 16B may include four instantiations of top tile portion H, each containing an instantiation of circuitry block 52 (e.g., circuitry block instantiations 52-1B, 52-2B, 52-3B, and 52-4B), and four instantiations of bottom tile portion G, each containing an instantiation of circuitry block 54 (e.g., circuitry block instantiations 54-1B, 54-2B, 54-3B, and 54-4B). Additionally, image sensor 16B may include two instantiations of left tile portion B, each containing one instantiation of circuitry block 56 (e.g., circuitry blocks 56-1B and 56-2B) and two instantiations of right tile portion A.

These examples of image sensors and corresponding die layouts are merely illustrative. If desired, any suitable stitched die layout may be formed based on reticle set 40 in FIG. 3 or any other suitable reticle set.

For some circuitry blocks, only one instantiation of that circuitry block needs to be active or used in order for the integrated circuit die to function properly. As such, a selected instantiation of that circuitry block may be hard-enabled using dedicated and hard-coded routing paths, while the remaining instantiations of that circuitry block may be hard-disabled (e.g., by more or less permanently decoupling or disconnecting the remaining instantiations from other circuitry such as circuitry intended to be coupled to that circuitry block). This type of hard-coding may occur during the fabrication/layout process (e.g., the hard-coded routing paths may be part of the circuit design used for fabrication), and the final fabricated integrated circuit may already include these hard-coded routing paths and disconnections.

However, issues may arise when the hard-enabled instantiation of that circuitry block is faulty or nonfunctional, leading to a faulty or nonfunctional integrated circuit die. This results in inefficiencies because such an integrated circuit die may still include nonfaulty or functional instantiations of that same circuitry block, but given that the faulty circuitry block instantiation is hard-enabled, it is difficult to make use of the other instantiations.

To address these issues, integrated circuit dies may include circuitry for testing and selecting (functional) instantiations of the same circuitry block to improve overall die yield as a nonfunctional integrated circuit die in the above scenario (e.g., with a hard-coded faulty instantiation) would instead be functional if it includes at least one functional instantiation out of all of the instantiations of the same circuitry block.

Figure 5:
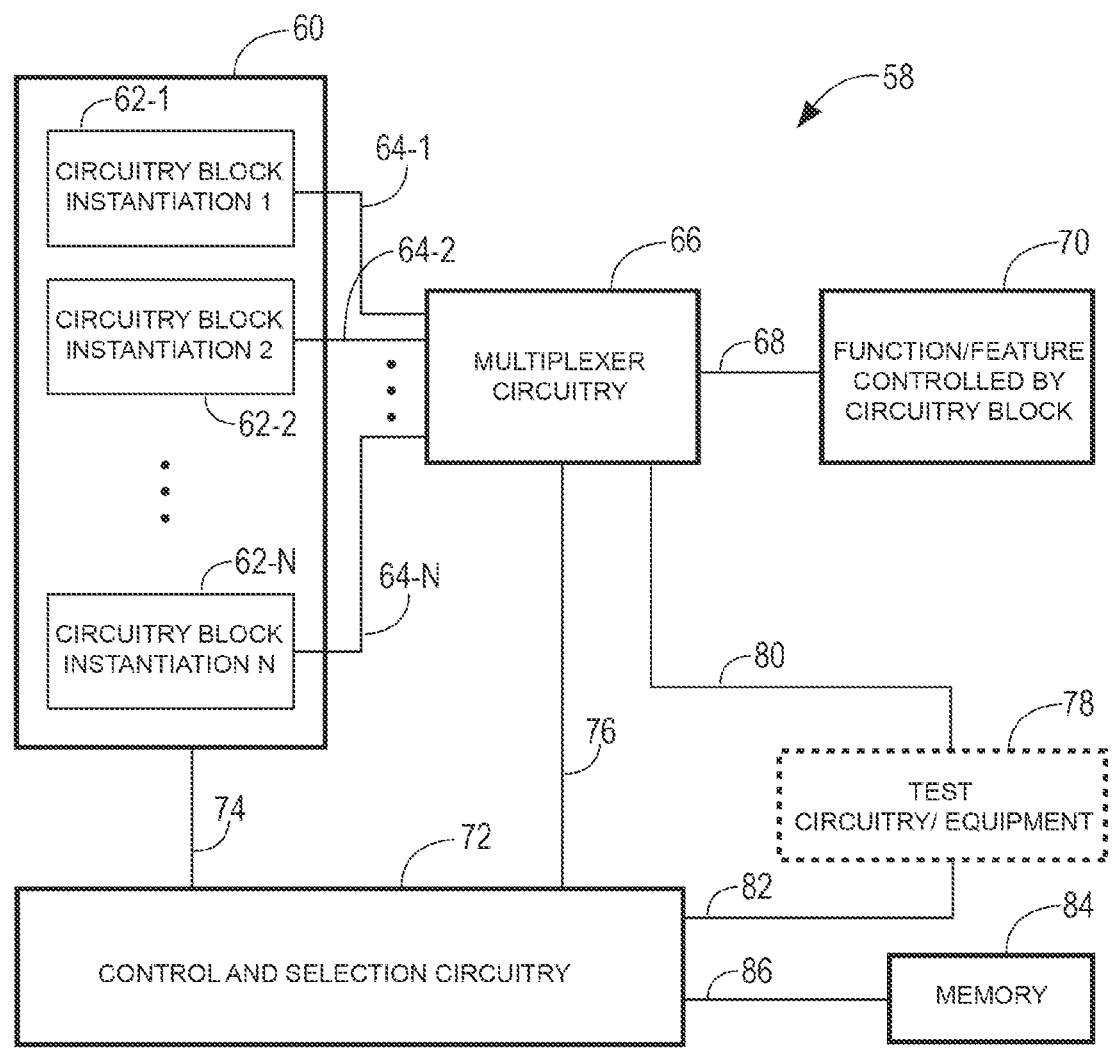
FIG. 5 is a diagram of an illustrative integrated circuit die having multiple circuitry block instantiations and selection circuitry for identifying functional circuitry block instantiations using test circuitry in accordance with some embodiments.

FIG. 5 is a diagram showing illustrative circuitry on integrated circuit die 58 that enables testing and selection of a functional circuitry block instantiation. As shown in FIG. 5, integrated circuit die 58 may include a set of instantiations 60 for the same circuitry block. Depending on the die layout of the integrated circuit die, the same circuitry block may include any suitable number of instantiations. While FIG. 5 shows N instantiation 62-1, 62-2, . . . , 62-N, this is merely illustrative. If desired, any circuitry block with two or more instantiations may be used. As examples, instantiation set 60 may be the set of instantiations 52 in FIG. 4A (e.g., having instantiations 52-1A, 52-2A, and 52-3A), the set of instantiations 54 in FIG. 4A (e.g., having instantiations 54-1A, 54-2A, and 54-3A), the set of instantiations 52 in FIG. 4B (e.g., having instantiations 52-1B, 52-2B, 52-3B, and 52-4B), the set of instantiations 54 in FIG. 4B (e.g., having instantiations 54-1B, 54-2B, 54-3B, and 54-4B), or the set of instantiations 56 in FIG. 4B (e.g., having instantiations 56-1B and 56-2B).

Routing paths 64 may connect each of the circuitry block instantiations in the same set to multiplexer circuitry 66. Multiplexer circuitry 66 may select and route one of the circuitry block instantiations 62 to connect to feature 70 via path 68. As an example, feature 70 may be or include analog circuits formed from one or more of components such as resistors, capacitors, inductors, diodes, transistors, amplifiers, switches, and/or other adjustable circuitry exhibiting a variable capacitance, resistance and/or inductance. As other examples, feature 70 may be or include digital circuits formed from one or more of components such as logic gates, transistors or switches, latches, and/or registers. As yet other examples, feature 70 may be analog or digital processing circuitry, memory circuitry, control circuitry, image sensor array circuitry, power management output circuitry, or any other suitable functional circuitry. Configurations in which feature 70 is a functional circuit enabled to be controlled by any one of circuitry block instantiations 62 are described herein as an example. However, if desired, feature 70 may be a functional circuit merely communicatively coupled to one of circuitry blocks 62.

Control and selection circuitry 72 (sometimes referred to herein simply as control circuitry 72) may be coupled to the set of instantiations 60 (e.g., to each of circuitry block instantiations 62-1, 62-2, . . . , 62-N) via path 74 and to multiplexer circuitry 66 via path 76. In particular, control circuitry 72 may provide control signals to multiplexer circuitry 66 indicative of which one of paths 62 to connect to path 68 (e.g., which one of instantiations 62 to connect to feature 70). Control circuitry 72 may also provide control signals to configure one or more instantiations 62 (e.g., to configure and/or enable a selected instantiation 62 to be connected to feature 70, to configure and/or disable one or more instantiations 62 to be disconnected from feature 70, etc.).

Test circuitry 78 (sometimes referred to herein as test equipment 78) may be coupled to multiplexer 66 via path 66 and may be coupled to control circuitry 72 via path 82. As an example, test circuitry 78 may provide test signals to control circuitry 72. Based on the test signals, control circuitry 72 may provide control signals to configure one or more instantiations 62 (e.g., configure and/or enable an instantiation 62 to be tested by test circuitry 78). Control circuitry 72 may also provide control signals to multiplexer circuitry 66 may select a routing path 64 associated with the instantiation 62 to be tested by test circuitry 78. In particular, the selected routing path 64 may be connected to test circuitry 78 via path 80. In such a manner, test circuitry 78 may provide test signals to control circuitry 72 that enables testing of each of instantiations 62-1, 62-2, . . . , 62-N to identify one or more functional instantiations 62 and one or more nonfunctional instantiations 62.

As an illustrative example, test circuitry 78 may provide the test signals to test instantiations 62 in a desired sequence or order. In particular, the placement of a first instantiation 62 may be more optimal than that of a second instantiation 62 for operation due to factors associated with their locations (e.g., differences in spatial separation from feature 70 and/or other features, differences in heating dissipation, differences in power supply routing, routing congestion, etc.). As such, the more optimally placed instantiation may be tested first, and in such a manner, test circuitry 78 may determine a desired order of testing instantiations 62 (e.g., from a most optimal instantiation to a least optimal instantiation 62).

As a result of testing, test circuitry 78 may determine one or more functional instantiations 62 (e.g., a list of functional instantiations 62 ordered based on how optimal the placement of each functional instantiation 62 is, a single functional instantiation that is most optimally placed out of all functional instantiations, etc.). The one or more functional instantiations and/or their corresponding indications (e.g., addresses, locations, and other identifiers of the functional instantiations) may be stored on memory circuitry 84. If desired, test circuitry 78 may provide the indications of functional instantiations 62 to memory circuitry 84 directly and/or through control circuitry 72 via paths 82 and 86.

Memory circuitry 84 may be implemented as any suitable type of memory. As an example, memory circuitry 84 may be an on-die memory on integrated circuit die 58 such as one-time programmable memory (OTPM). Control circuitry 72 may be coupled to memory circuitry 84 and may be configured to access memory circuitry 84 (e.g., to identify and locate a functional instantiation 62 from the corresponding indication on memory circuitry 84).

Integrated circuit die 58 may include the set of circuitry block instantiations 62, multiplexer circuitry 66, feature 70, control circuitry 72, memory circuitry 84, and the corresponding routing paths. In some configurations, test circuitry 78 may be implemented separately from the integrated circuit die (e.g., as part of a separate test assembly or equipment) configured to be connected to the integrated circuit die via input-output interface circuitry such as ports and other interface circuits (e.g., at least partly forming paths 80 and 82). If desired, test circuitry 78 may be implemented on die 58 similar to other circuitry in FIG. 5.

During an initialization operation of the image sensor die, memory 84, which stores indications of functional instantiations 62, may provide an indication of a most optimal functional instantiation 62 to control circuitry 72 to select that instantiation 62 for normal operations. In particular, based on the indication of the most optimal functional instantiation 62, control circuitry 72 may provide control signals to enable that instantiation 62 and to route that instantiation 62 to feature 70 using multiplexer 66.

In configurations, where memory circuitry 84 stores corresponding indications for a list of functional instantiations 62 of the same circuitry block, control circuitry 72 may use the list of functional instantiations 62 to replace one or more faulty instantiations in real-time (e.g., during the normal operations of the image sensor die, after the image sensor die has already been initialized, etc.).

As a particular example, memory circuitry 84 may store indications of three functional instantiations of the same circuitry block: a first (most optimal) functional instantiation, a second (second-most optimal) functional instantiation, and a third (least optimal) functional instantiation. During initialization, control circuitry 72 may enable the first functional instantiation for use during normal operation. If, during normal operation, the first instantiation becomes faulty, control circuitry 72 may the disable the first instantiation and enable the second instantiation for use.

If desired, in scenarios where memory circuitry 84 stores only one functional instantiation for a given circuitry block, if the one functional instantiation becomes faulty (e.g., during normal operation), test circuitry 78 may be configured to perform additional tests to determine an additional functional instantiation for the given circuitry block. Control circuitry 72 may then continue the normal operation using the determined additional functional instantiation.

While only a single instantiation set 60 for a given circuitry block is shown in FIG. 5, an integrated circuit die may include multiple instantiation sets of different circuitry blocks (e.g., an instantiation set of circuitry block 52, an instantiation set of circuitry block 54, an instantiation set of circuitry block 56 in FIG. 4B). The embodiments described herein may be similarly applied to each instantiation set (e.g., using corresponding multiplexer circuitry for each instantiation set of a corresponding same circuitry block to couple to a respective feature, using shared or separate control and selection circuitry to control the instantiation set and the multiplexer circuitry, using memory circuitry to store indications of functional instantiations for each instantiation set, etc.).

Figure 6:
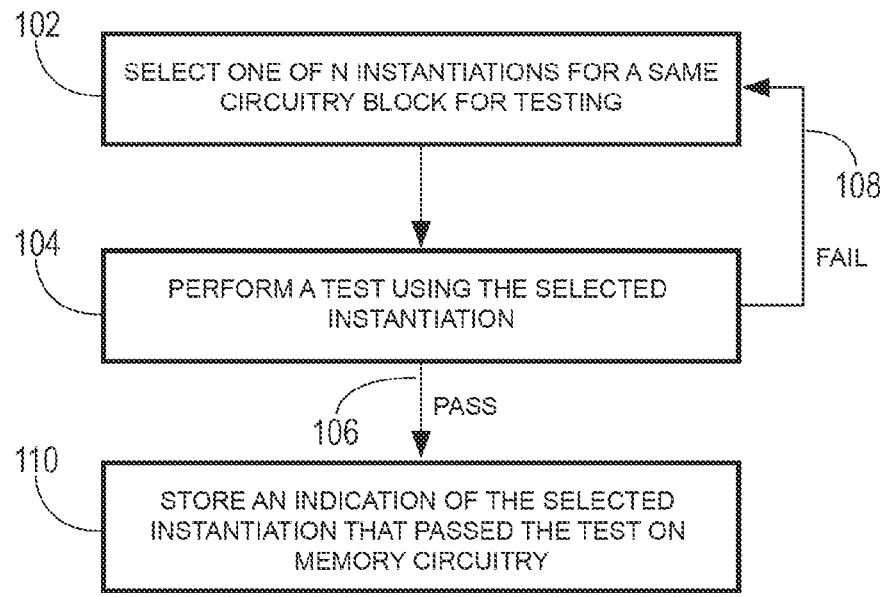
FIG. 6 is a flowchart of illustrative steps for testing the multiple circuitry block instantiations on an integrated circuit die such as the integrated circuit die of FIG. 5 in accordance with some embodiments.

FIG. 6 is a flowchart of illustrative steps for operating test circuitry such as test circuitry 78 in FIG. 5 to test circuitry block instantiations. As shown in FIG. 6, at step 102, the test circuitry may select one of N instantiations for a same circuitry block for testing. As an example based on FIG. 5, test circuitry 78 may provide test signals to control circuitry 78 to select instantiation 62-2 for testing. Instantiation 62-2 in FIG. 5 may, for example, correspond to circuitry block instantiation 52-2A in FIG. 4A and may be selected for testing first because of its centralized location (e.g., minimal average spatial separation from a feature controlled by it). As such, instantiation 62-2 may be configured for testing by control circuitry 72 (e.g., configured to receive power supply signals, configured to receive clock signals, etc.) and connected to test circuitry 78 via multiplexer circuitry 66.

At step 104, the test circuitry may perform the test using the selected instantiation. As an example based on FIG. 5, test circuitry 78 may receive test outputs from instantiation 62-2 via multiplexer 66, and based on the test outputs (e.g., when compared to expected outputs or threshold values), may determine whether or not instantiation 62-2 is functional. If desired, test circuitry 78 may provide test inputs to control circuitry 72 to provide to instantiations 62-2, and based on the test inputs, instantiation 62-2 may provide the test outputs.

If the selected instantiation passes the test (e.g., the test circuitry determines the selected instantiation to be functional), processing may proceed via path 106 to step 110. At step 110, the test circuitry may store an indication of the selected instantiation that passed the test on memory circuitry. As an example based on FIG. 5, if instantiation 62-2 passes the test, test circuitry 78 may provide an indication (e.g., address, locations, or other identifiers) of a functional instantiation 62-2 to memory circuitry 84 for storage.

If the selected instantiation fails the test (e.g., the test circuitry determines the selected instantiation to be faulty), processing may process via path 108 and loop back to step 102, where the test circuitry may select a second instantiation of the same circuitry block for testing. As an example based on FIG. 5, if instantiation 62-2 fails the test, test circuitry may provide test signals to control circuitry 78 to selected another instantiation 62-1 for testing.

Processing for the second instantiation 62-1 for testing may proceed similarly as described for the first instantiation 62-2 for testing based on steps 104 and 110, and paths 106 and 108. Processing of the different instantiations may proceed until at least one functional instantiation is identified and/or if all instantiations of the same circuitry block has been tested. In some configurations, the test circuitry may stop processing steps 102 once one functional instantiation has been identified (e.g., path 108 is used only if the current instantiation under test fails the test). In some configurations, the test circuitry may identify multiple functional instantiations such as a primary functional instantiation, a secondary functional instantiation for back up, etc. (e.g., path 108 is used even if the current instantiation under test passed the test to identify additional functional instantiations).

Figure 7:
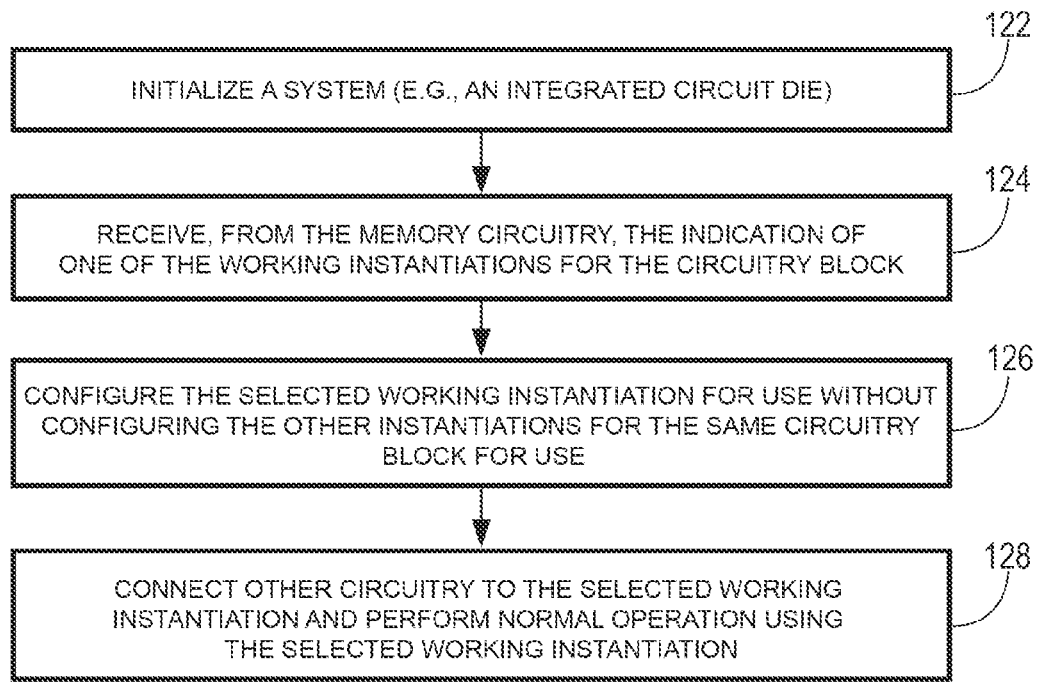
FIG. 7 is a flowchart of illustrative steps for operating an integrated circuit die such as the integrated circuit die of FIG. 5 using one or more functional circuitry block instantiations in accordance with some embodiments.

FIG. 7 is a flowchart of illustrative steps for operating an integrated circuit die such as integrated circuit die 58 in FIG. 5 with an identified functional instantiation of a circuitry block. As shown in FIG. 7, at step 122, the integrated circuit die (e.g., the integrated circuit die system) may be initialized (e.g., by providing power signals, by receiving an input, etc.). As an example based on FIG. 5, control circuitry 72 may receive power and/or other inputs to start the operation of integrated circuit die 58.

At step 124, the control circuitry may receive, from the memory circuitry, an indication of one of the working (functional) instantiations for the circuitry block. As an example based on FIG. 5, control circuitry 72 may receive, from memory circuitry 84 via path 86, an indication of a functional instantiation 62-2. Based on the indication, control circuitry 72 may identify functional instantiation 62-2 from the set of instantiations 60.

At step 126, the control circuitry may configure the selected working instantiation for use without configuring the other instantiations for the same circuitry block for use. As an example based on FIG. 5, control circuitry 72 may enable and configure functional instantiation 62-2 for normal operation. Control circuitry 72 may disable the remaining instantiations 62 (e.g., instantiations 62-1, 62-N, etc.) in instantiation set 60 and may not configure these remaining instantiations 62.

At step 128, the control circuitry may connect other circuitry to the selected working instantiation and may perform normal operations using the selected working instantiations. As an example based on FIG. 5, control circuitry 72 may control multiplexer circuitry 66 to connect functional instantiation 62-2 to feature 70 via paths 64-2 and 68. Circuitry block instantiation 62-2 and feature 70 may thereby operate in combination during normal operations (e.g., image sensor operations, generation of image data, etc.). The initialization operations in steps 122, 124, 126, and partially in step 128 may occur before normal operations (e.g., image sensor operations, generation of image data, etc.).

The examples of determining using the stored indications of functional instantiations with respect to timings for system initialization and/or normal operation as described in connection with FIGS. 6 and 7 are merely illustrative. If desired, the determination and/or use of indications of functional instantiations may occur at any time to determine and provide a functional instantiation for use.

In some configurations, an integrated circuit die may begin normal operation with a functional instantiation of a circuitry block (e.g., determined based on steps 102, 104, and 110 in FIG. 6, selected based on the steps of 122, 124, 126, and 128 in FIG. 7). However, during the course of operation, the functional instantiation may encounter issues that render the functional instantiation inoperable or non-functional. In this case, if the memory circuitry stores indications of additional functional instantiations of the same circuitry block, the control circuitry (e.g., control circuitry 72 in FIG. 5) may process steps 124, 126, and 128 to replace the newly inoperable instantiation with another functional instantiation of the same circuitry block. If the memory circuitry stores no other indications of functional instantiation for the same circuitry block, the test circuitry (e.g., test circuitry 78 in FIG. 5) may process steps of 102, 104, and 110 in FIG. 6 to determine one or more additional functional instantiations of the same circuitry block to replace the newly inoperable instantiation (e.g., by having the control circuitry subsequently process steps 122, 124, 126, and 128 in FIG. 7 using one of the determined additional functional instantiations).

Various embodiments have been described illustrating systems and methods for improving device yield for stitched image sensor dies.

As an example, an image sensor may be implemented using a stitched image sensor die. The stitched image sensor die may be formed from a step and repeat exposure process using a set of tiles in a reticle set. Multiple instantiations of a same circuitry block on a given tile may be patterned and formed on the image sensor die.

The image sensor die may include circuitry configured to enable testing of one or more instantiations of the same circuitry block. In particular, the image sensor die may include multiplexer circuitry that connects a selected one of the circuitry block instantiations to a feature meant to be coupled to the circuitry block (e.g., controlled by the circuitry block). The multiplexer circuitry may also connect a selected one of the circuitry block instantiations to test circuitry (e.g., implemented on-die or as separate equipment). The image sensor die may include control circuitry configured to configure (e.g., enable, disable, provide configuration signals to, etc.) one or more of the circuitry block instantiations and configured to control the multiplexer circuitry select one of the circuitry block instantiations for connection.

The test circuitry may be configured to test one or more of the circuitry block instantiations and may provide indications (e.g., addresses, locations, identifiers, etc.) of the functional circuitry block instantiations to memory circuitry on the image sensor die. During normal operation, the control circuitry may use the functional instantiation indicated by the indications stored on the memory circuitry for normal operation.

If desired, embodiments of the present invention described herein can be implemented generally in any suitable type of integrated circuit dies or systems such as a non-imaging system having a stitched integrated circuit die with duplicative circuitry blocks or IP blocks. In general, the systems and methods for forming, testing, and/or implementing integrated circuit dies described herein may be implemented in any suitable imaging or non-imaging system. It will be recognized by one of ordinary skill in the art, that the present exemplary embodiments may be practiced without some or all of these specific details. In other instances, well-known operations have not been described in detail in order not to unnecessarily obscure the embodiments described herein.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor die comprising:
   a plurality of circuitry block instantiations based on a circuitry block, any circuitry block instantiation in the plurality of circuitry block instantiations being configurable to be communicatively coupled to a circuit feature associated with the circuitry block; and
   multiplexer circuitry that is between each circuitry block instantiation of the plurality of circuitry block instantiations and the circuit feature and that connects a given circuitry block instantiation of the plurality of circuitry block instantiations to and disconnects each circuitry block instantiation of the plurality of circuitry block instantiations other than the given circuitry block instantiation from the circuit feature based on a stored indication that the given circuitry block instantiation is functional.

2. The image sensor die defined in claim 1, wherein each circuitry block instantiation in the plurality of circuitry block instantiations is coupled to the multiplexer circuitry via a respective path.

3. The image sensor die defined in claim 2, wherein the multiplexer circuitry is coupled to the circuit feature via an additional path, and the respective path of the given circuitry block instantiation is connected to the additional path.

4. The image sensor die defined in claim 1, wherein the given circuitry block instantiation is in an enabled state, and each circuitry block instantiation in the plurality of circuitry block instantiations other than the given circuitry block instantiation is in a disabled state.

5. The image sensor die defined in claim 1 further comprising:
   on-die programmable memory configured to store the indication that the given circuitry block instantiation is functional.

6. The image sensor die defined in claim 1 further comprising:
   a plurality of stitched portions, each portion being formed based on a tile in a reticle set.

7. The image sensor die defined in claim 6, wherein the tile is a pixel tile, and each portion in the plurality of stitched portions forms a respective portion of an image sensor pixel array.

8. The image sensor die defined in claim 6, further comprising:
   an additional plurality of stitched portions, each portion being formed based on a peripheral tile in the reticle set and comprising respective non-pixel circuitry.

9. An image sensor die comprising:
   a plurality of instantiations for a same circuitry block;
   a circuit feature that is controllable by the circuitry block;
   multiplexer circuitry coupled between the circuit feature and the plurality of instantiations, wherein the multiplexer circuitry is configured to pass a signal from a given instantiation in the plurality of instantiations to the circuit feature;
   control and selection circuitry coupled to each instantiation in the plurality of instantiations and the multiplexer circuitry; and
   memory circuitry coupled to the control and selection circuitry and configured to store an indication of at least one instantiation in the plurality of instantiations, the at least one instantiation including the given instantiation.

10. The image sensor die defined in claim 9, wherein the indication is indictive of a functional instantiation in the plurality of instantiations, the given instantiation is the functional instantiation, and the multiplexer circuitry is configured to connect the functional instantiation to the circuit feature based on the stored indication.

11. The image sensor die defined in claim 10, wherein the functional instantiation is in an enabled state, and each instantiation in the plurality of instantiations other than the functional instantiation is in a disabled state.

12. The image sensor die defined in claim 9, wherein the control and selection circuitry is configured to receive a test signal from test circuitry to test at least one instantiation of the plurality of instantiations.

13. The image sensor die defined in claim 12, wherein the multiplexer circuitry is configured to connect the at least one instantiation being tested to the test circuitry.

14. The image sensor die defined in claim 13, wherein the memory circuitry is configured to store an indication of the at least one tested instantiation, if functional, as the indication of at least one instantiation in the plurality of instantiations.

15. The image sensor die defined in claim 14, wherein the indication of the at least one tested instantiation comprises location information of the at least one tested instantiation.

16. A stitched integrated circuit die comprising:
   a plurality of circuitry block instantiations of a same circuitry block, wherein any of the plurality of circuitry block instantiations is configurable to be communicatively coupled to a circuit;
   memory circuitry configured to store information indicative of a functional circuitry block instantiation in the plurality of circuitry block instantiations; and control circuitry configured to provide a connection between the functional circuitry block instantiation and the circuit based on the stored information, wherein the control circuitry is configured to enable the functional circuitry block instantiation and disable any circuitry block instantiation in the plurality of circuitry block instantiations other than the functional circuitry block instantiation.

17. The stitched integrated circuit die defined in claim 16 further comprising:

an array of image sensor pixels, wherein non-pixel circuitry is formed along a periphery of the array of image sensor pixels.

18. The stitched integrated circuit die defined in claim 17, wherein the non-pixel circuitry includes the plurality of circuitry block instantiations.

19. The stitched integrated circuit die defined in claim 17, wherein the array of image sensor pixels and the non-pixel circuitry are formed from repeated instantiations of tiles in a reticle set.

20. The image sensor die defined in claim 9, wherein the multiplexer circuitry is configured to receive a corresponding signal from each of the plurality of instantiations and is configured to pass the signal from the given instantiation to the circuit feature without passing any of the corresponding signals other the signal from the given instantiation to the circuit feature.

* * * * *